(12) United States Patent
Nemeth et al.

(10) Patent No.: US 8,566,376 B2
(45) Date of Patent: Oct. 22, 2013

(54) SYSTEM AND METHOD FOR DATA COMPRESSION USING A FIELD PROGRAMMABLE GATE ARRAY

(75) Inventors: Tamas Nemeth, San Ramon, CA (US); Oliver Pell, London (GB); Raymond Ergas, San Clemente, CA (US)

(73) Assignee: Chevron U.S.A. Inc., San Ramon, CA (US)

( * ) Notice: Subject to any disclaimer, the term of this patent is extended or adjusted under 35 U.S.C. 154(b) by 510 days.

(21) Appl. No.: 12/847,243

(22) Filed: Jul. 30, 2010

(65) Prior Publication Data

US 2012/0030266 A1    Feb. 2, 2012

(51) Int. Cl.
   *G06F 7/00* (2006.01)
(52) U.S. Cl.
   USPC ............................................. 708/203
(58) Field of Classification Search
   None
   See application file for complete search history.

(56) References Cited

U.S. PATENT DOCUMENTS

| | | | |
|---|---|---|---|
| 5,867,167 A * | 2/1999 | Deering | 345/419 |
| 6,499,045 B1 * | 12/2002 | Turney et al. | 708/401 |
| 7,292,164 B1 | 11/2007 | Wegener | |
| 7,424,365 B2 | 9/2008 | Hassan et al. | |
| 7,480,416 B2 | 1/2009 | Liao et al. | |
| 7,577,667 B2 | 8/2009 | Hinshaw et al. | |
| 7,653,248 B1 | 1/2010 | Witzgall et al. | |
| 8,065,354 B1 * | 11/2011 | Donovan et al. | 708/203 |
| 2006/0050971 A1 | 3/2006 | Page et al. | |
| 2007/0185951 A1 | 8/2007 | Lee et al. | |
| 2008/0080307 A1 | 4/2008 | Eperjesi et al. | |
| 2008/0080310 A1 | 4/2008 | Eperjesi et al. | |
| 2008/0080311 A1 | 4/2008 | Eperjesi et al. | |
| 2008/0080312 A1 | 4/2008 | Eperjesi et al. | |
| 2009/0092002 A1 | 4/2009 | Souders et al. | |
| 2009/0234585 A1 | 9/2009 | Ross et al. | |
| 2012/0030266 A1 * | 2/2012 | Nemeth et al. | 708/203 |

* cited by examiner

*Primary Examiner* — David H Malzahn
(74) *Attorney, Agent, or Firm* — Marie L. Clapp

(57) ABSTRACT

A system and method for compressing and/or decompressing data uses a field programmable gate array (FPGA). In an embodiment, the method includes receiving data at the FPGA device, filtering the received data in a first dimension using a first logic structure of the FPGA device, storing the first filtered data in a memory of the FPGA device, filtering the received data in a second dimension using a second logic structure of the FPGA device, storing the second filtered data in the memory, quantizing the filtered data using a third logic structure of the FPGA device, encoding the quantized data using a fourth logic structure of the FPGA device to compress the data, and storing the encoded compressed data in a memory of the FPGA device.

14 Claims, 6 Drawing Sheets

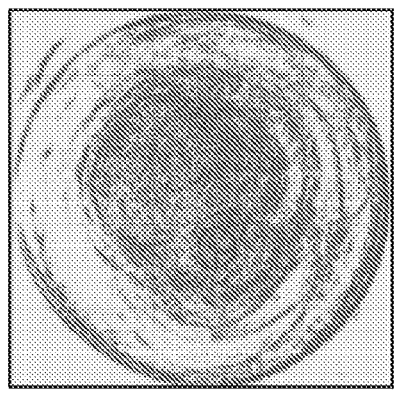 
FIG. 4A    FIG. 4B
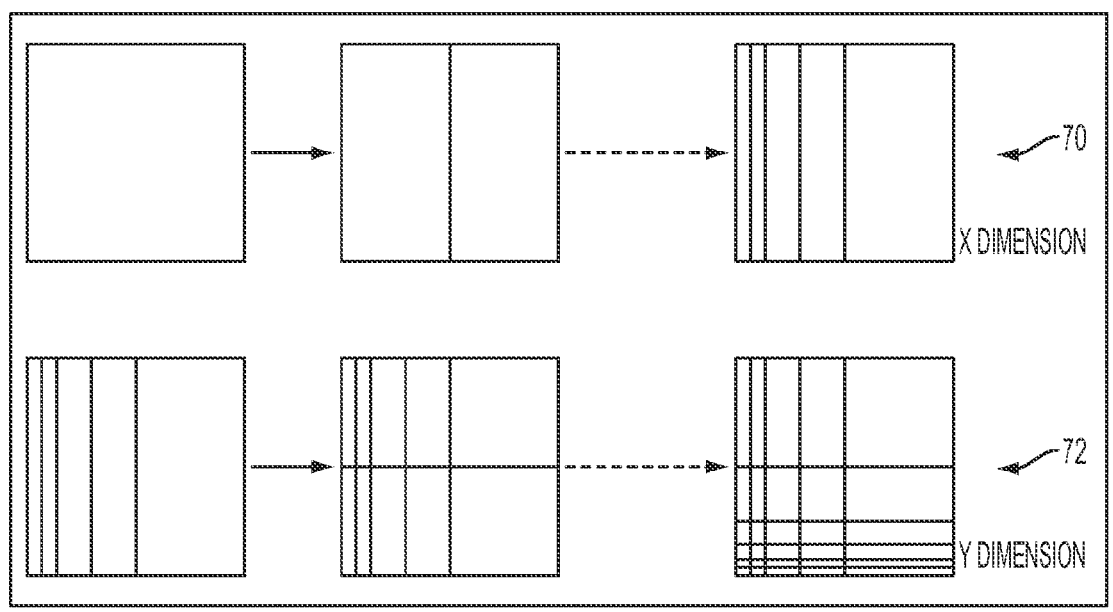
FIG. 5

SYSTEM AND METHOD FOR DATA COMPRESSION USING A FIELD PROGRAMMABLE GATE ARRAY

FIELD OF THE INVENTION

The present invention relates generally to methods and systems for data compression and decompression in hardware of a field programmable gate array (FPGA).

BACKGROUND OF THE INVENTION

In computing environments, FPGAs are typically used as accelerators for computation or for fast data storage devices. In particular, they are often incorporated into cards that interface using designs such as PCI Express Board architecture. Such cards may include, for example, graphics and/or sound cards that perform or assist in processing video or audio processing, reducing the processing load on the CPU. In many cases, the cards that contain FPGAs also include memory modules that may be accessed more quickly than other storage devices peripheral to the motherboard such as magnetic or optical disks.

Workflows incorporated into the hydrocarbon exploration process often require large amounts of temporary data to be available for processing by the CPU. Typically, such data is stored on magnetic disks, slowing access to the data. For the purposes, for example, of real time visualization applications, the disk access can constitute a processing bottleneck, preventing a user from getting the expected real-time response to changes in model parameters.

SUMMARY OF THE INVENTION

Described herein are implementations of various approaches to providing data compression and storage in a peripheral device for access by an application According to one implementation of the present invention, a computer implemented method for data compression using a field programmable gate array (FPGA) device, includes receiving data at the FPGA device, filtering the received data in a first dimension using a first logic structure of the FPGA device, storing the first filtered data in a memory of the FPGA device, filtering the received data in a second dimension using a second logic structure of the FPGA device, storing the second filtered data in the memory, quantizing the filtered data using a third logic structure of the FPGA device, encoding the quantized data using a fourth logic structure of the FPGA device to compress the data, and storing the encoded compressed data in a memory of the FPGA device.

In an embodiment, the method further includes decompressing the data, including decoding stored encoded data using a fifth logic structure of the FPGA, dequantizing the decoded data using a sixth logic structure of the FPGA. inverse filtering the dequantized data in the second dimension using a seventh logic structure of the FPGA, inverse filtering the dequantized data in the first dimension using an eighth logic structure of the FPGA, and outputting the decompressed data.

In an embodiment, the seventh logic structure is the same as the second logic structure, and the eighth logic structure is the same as the first logic structure and the inverse filtering is performed by passing the data through the second logic structure in reverse followed by passing the data through the first logic structure in reverse.

In an embodiment, a device for compressing data includes a peripheral device, in communication with the processor of a host system, the peripheral device comprising an FPGA and a memory, the FPGA including a first logic structure, configured and arranged to filter a bistream of data passing therethrough in a first dimension to produce first filtered data, a second logic structure, configured and arranged to filter a bistream of the first filtered data passing therethrough in a second dimension to produce second filtered data, a third logic structure, configured and arranged to quantize a bitstream of the second filtered data to produce quantized data, a fourth logic structure, configured and arranged to encode the quantized data using a fourth logic structure of the FPGA device to compress the data and to transmit the compressed data to the memory.

In an embodiment, the device further includes a fifth logic structure, configured and arranged to decode the compressed data, a sixth logic structure, configured and arranged to dequantize the decoded data, a seventh logic structure, configured and arranged to inverse filter the dequantized data in the second dimension, and an eighth logic structure, configured and arranged to inverse filter the dequantized data in the first dimension.

In an embodiment, a method of decompressing data using a field programmable gate array (FPGA) includes decoding stored encoded data using a first logic structure of the FPGA, dequantizing the decoded data using a second logic structure of the FPGA, inverse filtering the dequantized data in the second dimension using a third logic structure of the FPGA, inverse filtering the dequantized data in the first dimension using an fourth logic structure of the FPGA and outputting the decompressed data.

In an embodiment, a device for decompressing data includes a peripheral device, in communication with the processor of a host system, the peripheral device comprising an FPGA and a memory, the FPGA including a first logic structure, configured and arranged to decode the compressed data, a second logic structure, configured and arranged to dequantize the decoded data, a third logic structure, configured and arranged to inverse filter the dequantized data in the second dimension, and a fourth logic structure, configured and arranged to inverse filter the dequantized data in the first dimension.

In an embodiment, data volumes are stored in compressed form on a memory of an FPGA device and made available for access by a host system.

The above summary section is provided to introduce a selection of concepts in a simplified form that are further described below in the detailed description section. The summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

These and other features of the present invention will become better understood with regard to the following description, pending claims and accompanying drawings where:

FIGS. 4a and 4b illustrate an example of an initial data set representing a time slice of a wavefield of a modeled seismic shot (FIG. 4a) and a decomposed version of the data set (FIG. 4b);

FIG. 5 illustrates a wavelet decomposition in two dimensions, in which decomposition in an X-dimension precedes decomposition in a Y-dimension;

DETAILED DESCRIPTION OF THE INVENTION

Figure 1:
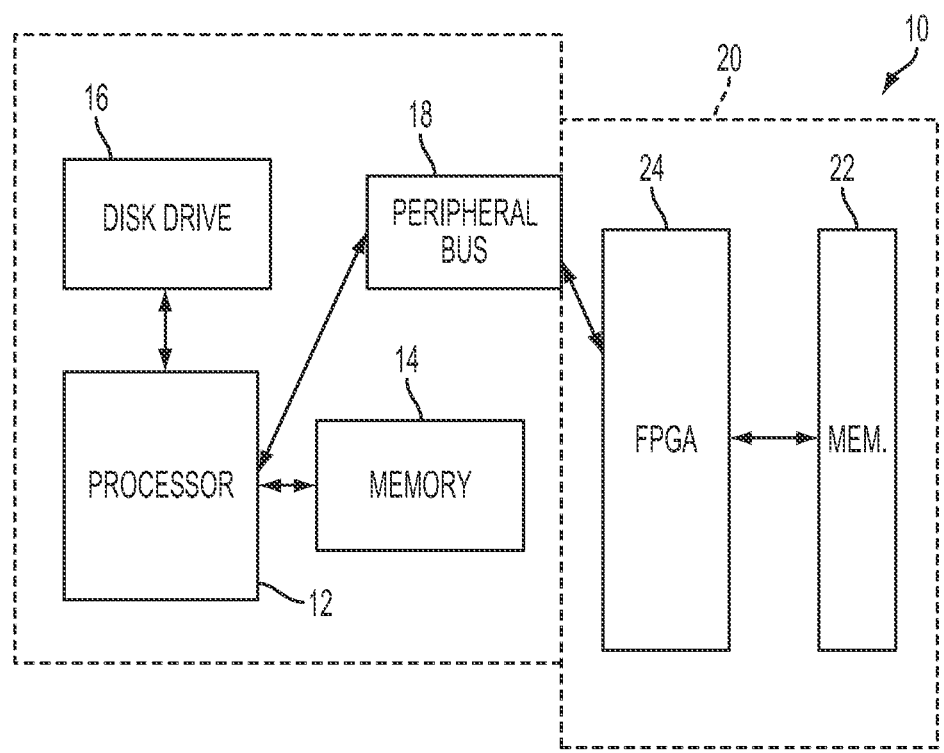
FIG. 1 schematically illustrates a computer system in accordance with an embodiment of the present invention.

FIG. 1 schematically illustrates a computer system in accordance with an embodiment of the present invention. A computer 10 acts as a host system and typically includes a processor 12, working memory 14, a disk drive 16, and a bus 18, that allows communication between the processor 12 and peripheral components. In a particular embodiment, the bus 18 is compliant with the PCI Express architecture, and allows for insertion of PCI express cards.

As will be appreciated, the illustrated working memory 14 and disk drive 16 may be considered generally to be system storage for the computer 10. In this regard, system storage generally may include one or both of system storage that is provided integrally (i.e., substantially non-removable) with the computer 10 and/or removable storage that is removably connectable to host system 10 via, for example, a port (e.g., a USB port, a firewire port, etc.) or a drive (e.g., a disk drive, etc.). System information may include one or more of optically readable storage media (e.g., optical disks, etc.), magnetically readable storage media (e.g., magnetic tape, magnetic hard drive, floppy drive, etc.), electrical charge-based storage media (e.g., EEPROM, RAM, etc.), solid-state storage media (e.g., flash drive, etc.), and/or other electronically readable storage media. System storage may store software algorithms, information related to an output generated by an electronic display (not shown) associated with the computer 10, information determined by the processor 12, information transmitted to and/or received from external or peripheral devices, and/or other information that enables the computer 10 to process information and/or manage the processing of information properly. System storage 14, 16 may be separate components within the computer 10 or may be provided integrally on a common motherboard thereof. Likewise, the computer 10 may consist of a single PC, workstation, server or may be a portion or all of a group of networked computers, which may be interconnected in either a wired or wireless configuration.

A peripheral device 20, which in a particular embodiment is a PCI Express card, is in communication with the processor 12 via the bus 18. Though the figure illustrates the peripheral device 20 as being separated from the computer 10 by dashed lines, they may, in principle, be physically within a single housing, or may be separately housed. Likewise, the bus 18 may, in principle, constitute a direct physical connection or another communication avenue. For example, the processor 12 may communicate with the peripheral device 20 wirelessly via radio, IR, across a network or by other means.

In an embodiment, the peripheral device 20 includes a memory 22 and an FPGA 24 in communication and operational association with the memory 22. For the purposes of the following discussion, the combination of the memory 22 and the FPGA 24 may together be considered to constitute an FPGA device.

In an embodiment, the memory 22 (which may be referred to as card memory in this embodiment) and FPGA 24 are components of a common card, which constitutes the peripheral device 20, and are interconnected with an appropriate communication bus (not shown, particular communications are schematically illustrated with arrows in the Figure). Though memory 22 is illustrated as a single module, it may constitute a number of memory devices which may be commonly or separately accessible. Likewise, the FPGA 24 may constitute an array disposed on a single chip, or may be spread across a number of individual FPGA devices, each of which may include one or more of logic structures for performing steps in accordance with embodiments of the invention.

Figure 2:
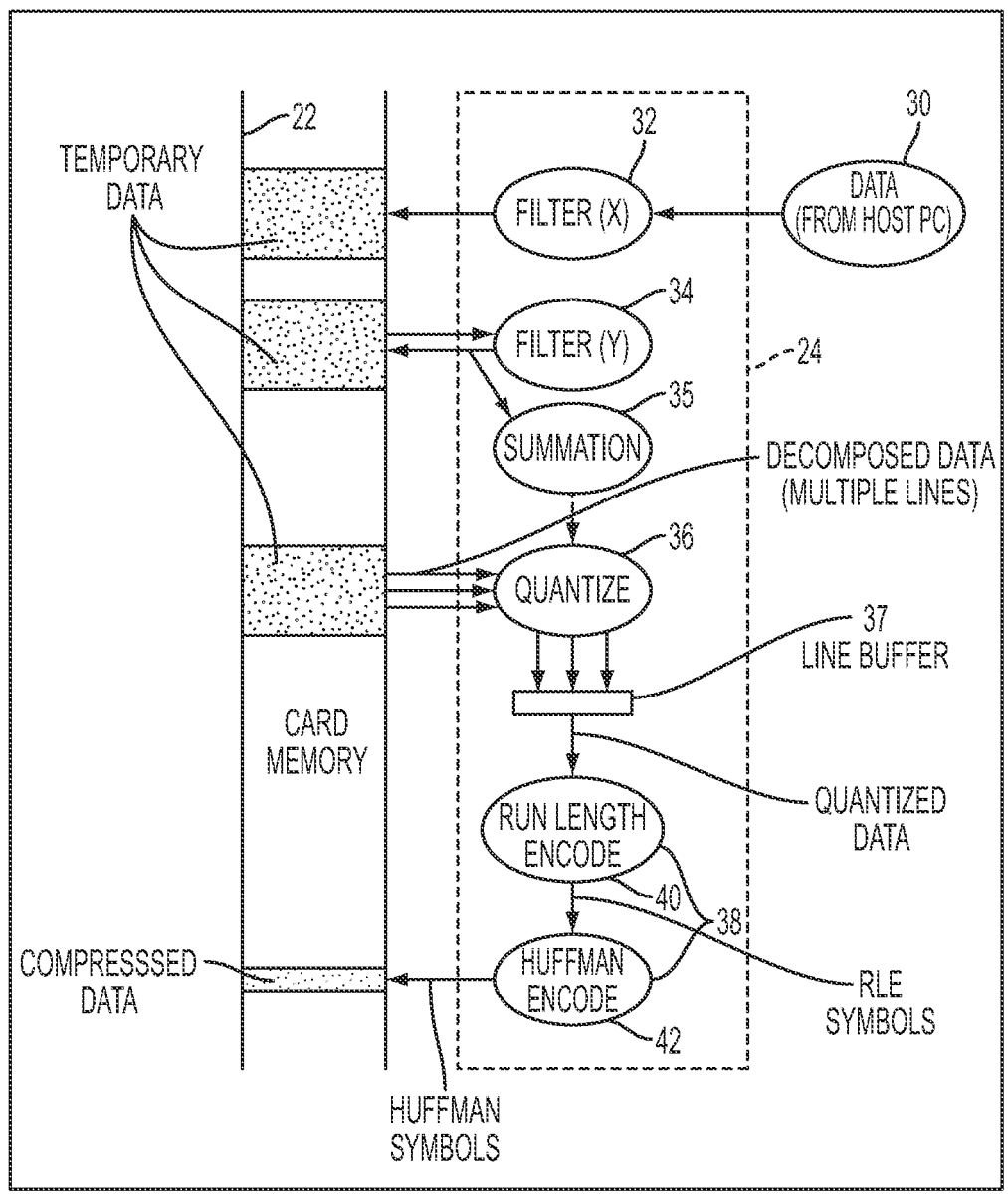
FIG. 2 schematically illustrates a data compression method and associated hardware implementation in accordance with an embodiment of the present invention.

FIG. 2 schematically illustrates a compression algorithm using the peripheral device 20 of FIG. 1 in accordance with an embodiment of the present invention. Data 30, which may be, for example, geophysical data such as seismic data, horizon data, lithological data, well log data or other data representing physical structures, geological formations, other spatially or temporally sampled data, or the like, is received from a host computer (not shown). As will be appreciated, the data may originate from an active process being performed on the host computer or may be previously stored data.

The data passes through the FPGA, which is configured according to a logic structure 32 that is configured and arranged to perform a filtering operation on the data in a first dimension. In the illustrated example, the logic structure 32 of the FPGA is configured to perform a filtering process in the X-dimension. The filtered data is then transferred to the card memory 22 for temporary storage.

Next, the filtered data is transferred to a logic structure of the FPGA 34 that performs a second filtering function as the bitstream of data passes through the logic structure. In the illustrated example, the second logic structure is configured and arranged to perform a filtering process in the Y-dimension. The now twice filtered data may then be transferred back to the card memory 22. In principle, data may be directly passed from one logic structure to the next without an intervening pass to the memory for temporary storage, but this approach would generally require in-chip buffering to allow X dimension data to accumulate for Y dimension readout. Also, in principle, the X and Y filter structures could be a single piece of hardware configured differently at different points in time, or could be different pieces of hardware running in parallel.

Though the filtering is described above as occurring in respective X and Y dimensions, it will be apparent that for two dimensional data, any two dimensions that define a basis for the two dimensional plane may be used. By way of example, where there is a particular off-axis anisotropy in the data, it may be useful to define a basis for the space using non-perpendicular dimensions, as long as the defined dimensions span the space and are linearly independent, or otherwise define a basis for the space. In another example, one of the dimensions could be time, i.e., the X-time domain or the Y-time domain may be of interest. Furthermore, the device and method described herein may be applied to one-dimensional, three-dimensional or four-dimensional data sets as well, with use of the appropriate number of logic structures.

The data is then passed to a logic structure 36 that quantizes the filtered data. The quantization of the data may involve forcing real number data to an integer representation, or other selected type of quantization, depending on the specific mathematical approach adopted. Another approach involves division by a quantization factor and rounding to produce the quantized data. Quantization parameters may be uniform for the entire data set, or may be applied using specific parameters for each sub-band or for selected groups of sub-bands. In an embodiment, prior to the quantization step there may be a summation step that helps to determine certain of the parameters to be used for quantization. As with the other operations, the summation step may be programmed into a logical structure of the FPGA such that the operation is performed as the bitstream passes through the logical structure 35.

From the quantizing logic structure 36, the quantized data is passed to a logic structure 38 configured and arranged to encode the quantized data to compress it. The quantized data passes to the encoder 38 by way of a line buffer 37. The line buffer 37 allows a transform from multiple line input (the output of the previous filtering) to multiple points within a line, simplifying certain types of encoding. In the illustrated example, the quantized data is first run-length encoded by a run-length encoding logic structure 40 and then Huffman encoded by Huffman encoding logic structure 42 in order to implement the compression. As will be appreciated, the specific encoding approaches may be varied, and other entropy encoding algorithms may replace Huffman encoding. Likewise, lossy compression algorithms may, in principle, be used.

Once compressed, the data is passed back to the memory 22 for storage.

Figure 3:
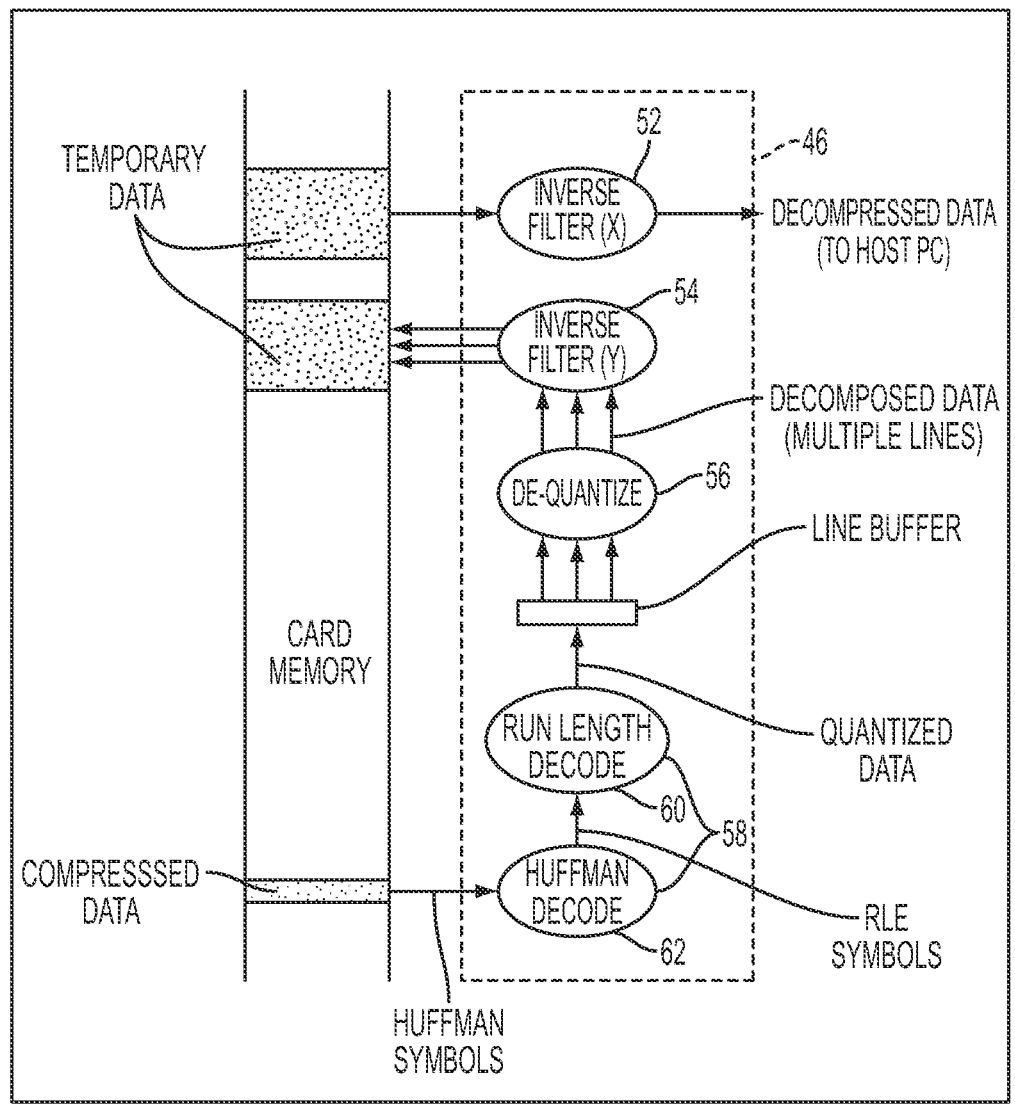
FIG. 3 schematically illustrates a data decompression method and associated hardware implementation in accordance with an embodiment of the present invention.
Figure 6A:
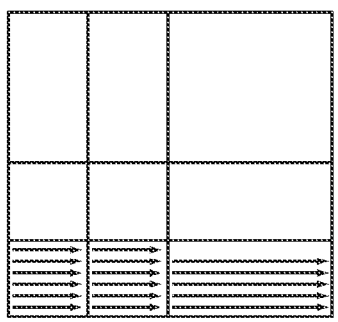
FIGS. 6a and 6b illustrate an X-order run length operation and an alternative Y-order run length operation.
Figure 6B:
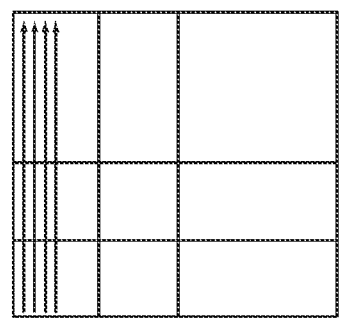

FIG. 3 schematically illustrates a decompression algorithm using a peripheral device 20 in accordance with an embodiment of the present invention.

Though FIG. 3 illustrates the decompression algorithm with reference to different components from those shown in FIG. 2 such as memory 44, FPGA 46, inverse X filter 52, inverse Y filter 54, dequantizing logical structure 56, and decoding logic structure 58, the decompression algorithm may, at least in part, be implemented by simply reversing the bistream flow through the FPGA and using the FIG. 2 components. In particular, the reverse flow approach could be applied to wavelet transforms, such as are applicable to the X and Y filters.

The compressed data is passed to the decoding logic structure 58 structure that is configured and arranged to reverse the coding process performed by logic structure 38. In the particular example illustrated, the data first passes through a logic structure that performs Huffman decoding. Next, the partially decoded data passes through logic structure 60 which performs run length decoding, producing an output that will be made up of quantized data.

The quantized data is then passed through a logic structure 56 that performs dequantization. In an embodiment, dequantization is performed by multiplying the quantized data by a quantization factor that was used in the quantization process during compression.

The dequantized data then passes through an inverse filter 54 that includes a logic structure that is configured and arranged to perform an inverse filtering operation on the data in the second dimension. The one dimensionally inverse filtered data is passed to the memory 44 for temporary storage.

The one dimensionally inverse filtered data is then passed from the memory to a second inverse filter 52. The second inverse filter 52 contains a logic structure that is configured and arranged to perform an inverse filtering operation on the data in the first dimension, producing decompressed data which may then be passed back to the host system. In principle, the dimensions may be processed in any order for symmetric filters such as the wavelet transform.

In a particular example, the algorithm begins with a data set to be compressed, such as the one illustrated in FIG. 4a. The example data set is a two-dimensional wavefield slice in X-Y and represents modeled data.

First, the data is decomposed using a two dimensional wavelet decomposition. As will be appreciated from the foregoing description, this is the function performed by the two filters 32, 34. Alternate wavelet decomposition schemes include Laplacian, line, quincunx, pyramid, uniform and adaptive schemes. The decomposition of each dimension is performed using a filtering process that recursively reduces each line of the data into low and high frequency components. The end product of this decomposition is a collection of frequency components arrayed in a number of sub-bands. The result of such a decomposition is illustrated in FIG. 4b, produced using the data illustrated in FIG. 4a.

In this regard, FIG. 5 illustrates a process of wavelet decomposition in two dimensions. First, the data space is iteratively decomposed into sub-bands 70 in the X-dimension. Next, the X-decomposed data is iteratively decomposed into sub-bands 72 in the Y-dimension.

Once sub-bands are established, a maximum amplitude may be determined for each sub-band. Likewise, a total energy for the entire area may be calculated. In the example, this operation is performed by the summation logical structure 35.

Using the calculated total energy and the maximum amplitude for each sub-band, quantization parameters are determined. For approaches in which a single set of quantization parameters are to be used, the maximum amplitude of a single sub-band, for example the sub-band with the largest maximum amplitude, may be sufficient to select the appropriate quantization parameters. The quantization step is performed by passing the data through the quantizing logic structure 36.

In most situations, the quantization process will produce a large proportion of zero values for the data set. As a result, a run length encoding process as performed by logic structure 40 is efficient at compressing the data preliminary to applying an entropy based encoding algorithm. Finally, the resulting run length encoded data (RLE symbols) are Huffman encoded such as by a Huffman encoding logic structure 42 and thereby transformed into fully compressed data (Huffman symbols) for storage, for example in the memory 22.

In a related example of decompression, the Huffman symbols are transferred from memory to a Huffman decoder such as logic structure 62 thereby reproducing the RLE symbols. The RLE symbols are then decoded using an RLE decoder such as logic structure 60, regenerating quantized data.

The quantized data are then dequantized by scaling each value and converting it to a floating-point representation. This function is performed by dequantizing logic structure 56, which in turn passes the data on to be recomposed. Recomposition of the sub-bands, such as by use of inverse filters 52, 54, produces decompressed data.

Primarily because the quantization process is somewhat lossy, the decompressed data will not be identical to the original data. However, as illustrated in FIGS. 7a-7c, the decompressed data may include only a small error.

Figure 7A:
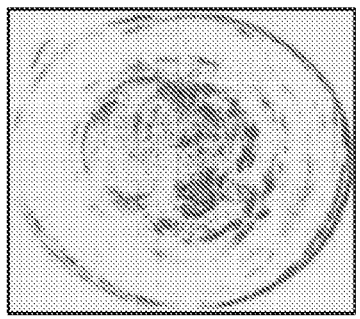
FIGS. 7a, 7b, and 7c illustrate test data (FIG. 7a), the data of FIG. 7a compressed and decompressed (FIG. 7b), and a difference between the original data and the regenerated data, with a factor of 100× (FIG. 7c)
Figure 7B:
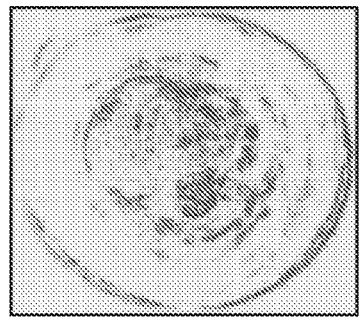
Figure 7C:
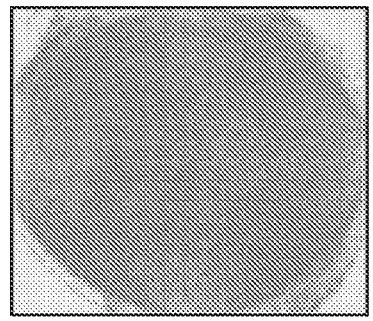

FIG. 7a illustrates original data while FIG. 7b illustrates compressed and regenerated data. FIG. 7c shows a difference between FIGS. 7a and 7b, with values multiplied by 100, illustrating that only a relatively small error has been introduced by the compression/decompression round-trip.

Figure 8:
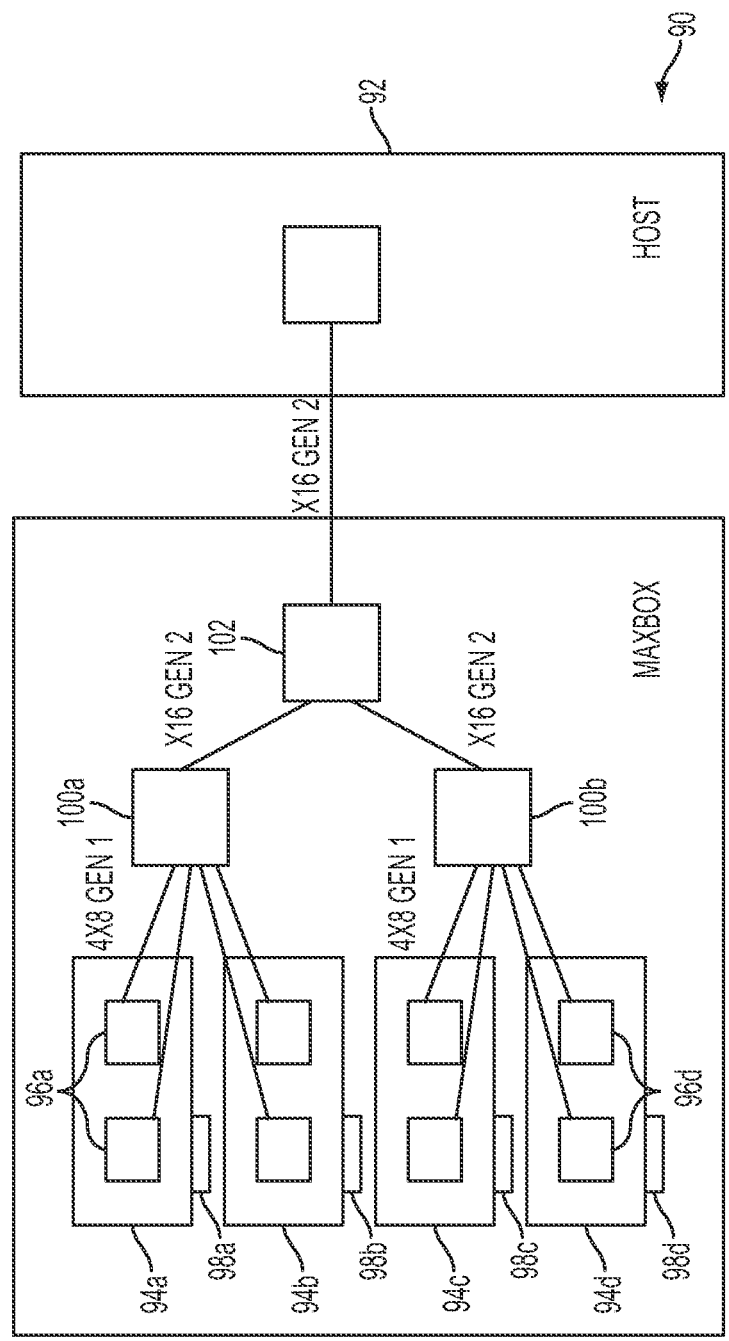
FIG. 8 schematically illustrates a scaled system in accordance with an embodiment of the present invention.

FIG. 8 illustrates an example of scalability of devices in accordance with an embodiment of the invention. A data processing system 90 includes a host system 92 in communication with a four cards 94a-94d. Each card 94a-94d includes two FPGA chips 96 and a memory 98. Each group of four chips 96 is in communication with node points 100a, 100b. These links are in turn in communication with note point 102 which then links in turn to the host 92. In an embodiment, the links may be faster at each level, or faster at the upper levels than at the card level, because as the levels progress, the bandwidth is shared among two, then four, then eight FPGA chips.

Depending on the specific algorithm used and parameters selected in developing the logic structures programmed into the FPGA, compression ratios between 5× and 25× may be achieved consistent with the principles of the present invention. In an embodiment using a PCI card having 24 GB RAM on board, this may allow for fast access storage of greater than 0.5 TB at high compression ratios. Likewise, a host computer may incorporate a number of such cards allowing for nearly 2.5 TB of total memory when using four cards, for example.

While in the foregoing specification this invention has been described in relation to certain preferred embodiments thereof, and many details have been set forth for purpose of illustration, it will be apparent to those skilled in the art that the invention is susceptible to alteration and that certain other details described herein can vary considerably without departing from the basic principles of the invention. In addition, it should be appreciated that structural features or method steps shown or described in any one embodiment herein can be used in other embodiments as well.

What is claimed is:

1. A method of compressing data using a field programmable gate array (FPGA) device, comprising:
   receiving data at the FPGA device;
   filtering the received data in a first dimension using a first logic structure of the FPGA device;
   storing the first filtered data in a memory of the FPGA device;
   filtering the received data in a second dimension using a second logic structure of the FPGA device;
   storing the second filtered data in the memory;
   performing sub-band analysis on the second filtered data to determine a maximum amplitude for at least one sub-band and a total energy for an entire area of the second filtered data;
   quantizing, using the maximum amplitude and total energy, the second filtered data using a third logic structure of the FPGA device;
   encoding the quantized data using a fourth logic structure of the FPGA device to compress the data; and
   storing the encoded compressed data in a memory of the FPGA device.

2. A method as in claim 1, wherein the filtering in the first and second dimensions comprises wavelet transformation of the data.

3. A method as in claim 1, wherein the encoding comprises one or more compression algorithms selected from the group consisting of run-length encoding, entropy encoding, LZW compression, Huffman encoding, and arithmetic encoding.

4. A method as in claim 1, further comprising decompressing the stored encoded compressed data using logic structures of the FPGA.

5. A method as in claim 4, wherein the decompressing further comprises:
   decoding the stored encoded compressed data using a fifth logic structure of the FPGA;
   dequantizing the decoded data using a sixth logic structure of the FPGA;
   inverse filtering the dequantized data in the second dimension using a seventh logic structure of the FPGA;
   inverse filtering the dequantized data in the first dimension using an eighth logic structure of the FPGA; and
   outputting the decompressed data.

6. A method as in claim 5, wherein the seventh logic structure is the same as the second logic structure, and the eighth logic structure is the same as the first logic structure and the inverse filtering is performed by passing the data through the second logic structure in reverse followed by passing the data through the first logic structure in reverse.

7. A method as in claim 5, wherein the fifth, sixth, seventh, and eighth logic structures are arranged in order in the FPGA such that as a bitstream of the data is passed through the FPGA logic structures, it is output as the decoded data.

8. A method as in claim 1, wherein the first, second, third, and fourth logic structures are arranged in order in the FPGA such that as a bitstream of the data is passed through the FPGA logic structures, it is output as the encoded data.

9. A device for compressing data comprising:
   a peripheral device, in communication with the processor of a host system, the peripheral device comprising an FPGA and a memory;
   the FPGA comprising:
      a first logic structure, configured and arranged to filter a bitstream of data passing therethrough in a first dimension to produce first filtered data;
      a second logic structure, configured and arranged to filter a bistream of the first filtered data passing therethrough in a second dimension to produce second filtered data;
      a third logic structure, configured and arranged to performing sub-band analysis on the second filtered data to determine a maximum amplitude for at least one sub-band and a total energy for an entire area of the second filtered data and to quantize a bitstream of the second filtered data to produce quantized data;
      a fourth logic structure, configured and arranged to encode the quantized data using a fourth logic structure of the FPGA device to compress the data and to transmit the compressed data to the memory.

10. A device as in claim 9, wherein the FPGA device comprises a plurality of FPGA chips and the logic structures are distributed among the FPGA chips.

11. A device as in claim 9, wherein the FPGA device comprises a plurality of FPGA chips and a single FPGA chip comprises the logic structures.

12. A device as in claim 9, wherein, when the processor of the host system requires access to the compressed data, the compressed data is decompressed by passing through the logic structures of the FPGA and transmitted to the processor for use.

13. A device as in claim 9, wherein the FPGA further comprises:
   a fifth logic structure, configured and arranged to decode the compressed data;
   a sixth logic structure, configured and arranged to dequantize the decoded data;
   a seventh logic structure, configured and arranged to inverse filter the dequantized data in the second dimension;
   an eighth logic structure, configured and arranged to inverse filter the dequantized data in the first dimension.

14. A device as in claim 13, wherein the seventh logic structure is the same as the second logic structure and the eighth logic structure is the same as the first logic structure, and the inverse filtering is performed by passing the data through the first and second logic structures in reverse.

\* \* \* \* \*